(12) United States Patent
Feng et al.

(10) Patent No.: US 10,236,073 B2
(45) Date of Patent: Mar. 19, 2019

(54) SHIFT REGISTER, GATE DRIVING CIRCUIT AND DISPLAY DEVICE

(71) Applicants: BOE TECHNOLOGY GROUP CO., LTD., Beijing (CN); HEFEI BOE OPTOELECTRONICS TECHNOLOGY CO., LTD., Anhui (CN)

(72) Inventors: Silin Feng, Beijing (CN); Hongmin Li, Beijing (CN)

(73) Assignees: BOE TECHNOLOGY GROUP CO., LTD., Beijing (CN); HEFEI OPTOELECTRONICS TECHNOLOGY CO., LTD., Anhui (CN)

( * ) Notice: Subject to any disclaimer, the term of this patent is extended or adjusted under 35 U.S.C. 154(b) by 69 days.

(21) Appl. No.: 15/542,239

(22) PCT Filed: Jan. 5, 2017

(86) PCT No.: PCT/CN2017/070259
§ 371 (c)(1),
(2) Date: Jul. 7, 2017

(87) PCT Pub. No.: WO2017/219658
PCT Pub. Date: Dec. 28, 2017

(65) Prior Publication Data
US 2018/0211717 A1    Jul. 26, 2018

(30) Foreign Application Priority Data
Jun. 22, 2016    (CN) .......................... 2016 1 0454724

(51) Int. Cl.
*G11C 19/28*    (2006.01)
*G09G 3/36*    (2006.01)

(52) U.S. Cl.
CPC ............... *G11C 19/28* (2013.01); *G09G 3/36* (2013.01); *G09G 3/3677* (2013.01);
(Continued)

(58) Field of Classification Search
CPC ...... G09G 3/36; G09G 3/3674; G09G 3/3677; G09G 2310/0286; G09G 2310/08; G11C 19/28; G11C 19/287
See application file for complete search history.

(56) References Cited

U.S. PATENT DOCUMENTS 6,339,631 B1    1/2002  Yeo et al.
9,530,520 B2 *  12/2016  Xu .......................... G11C 19/28
(Continued)

FOREIGN PATENT DOCUMENTS

CN    103500551 A    1/2014
CN    103578433 A    2/2014
(Continued)

OTHER PUBLICATIONS

International Search Report for PCT Application No. PCT/CN2017/070259 dated Mar. 20, 2017.
(Continued)

*Primary Examiner* — Patrick O Neill
(74) *Attorney, Agent, or Firm* — Calfee, Halter & Griswold LLP

(57) ABSTRACT

A shift register, a gate driving circuit, and a display device are provided. The shift register includes an input unit, a first control unit, a second control unit, a voltage gating unit, an output unit, an energy storage unit and a reset unit. The shift register can output dual driving signals with fewer switching elements. When it is applied to the gate driving circuit, the total number of switching elements included in the gate driving circuit can be reduced, the wiring can be simplified, and the area occupied by the gate driving circuit can be
(Continued)

decreased, thereby facilitating narrowing to the frame of the display device.

20 Claims, 3 Drawing Sheets

(52) U.S. Cl.
CPC ... *G11C 19/287* (2013.01); *G09G 2310/0286* (2013.01); *G09G 2310/08* (2013.01)

(56) References Cited

U.S. PATENT DOCUMENTS

| | | | |
|---|---|---|---|
| 9,721,510 B2* | 8/2017 | Xu | ............ G11C 19/28 |
| 9,905,192 B2* | 2/2018 | Wu | ............ G09G 3/20 |
| 9,990,897 B2* | 6/2018 | Pang | ............ G11C 19/287 |
| 2007/0247932 A1 | 10/2007 | Tobita | |
| 2014/0159997 A1 | 6/2014 | Chen et al. | |
| 2015/0318053 A1 | 11/2015 | Zhang et al. | |
| 2016/0027526 A1 | 1/2016 | Xu | |
| 2016/0125955 A1 | 5/2016 | Pang | |
| 2017/0193938 A1 | 7/2017 | Feng et al. | |
| 2017/0358267 A1* | 12/2017 | Feng | ............ G09G 3/3648 |

FOREIGN PATENT DOCUMENTS

| | | |
|---|---|---|
| CN | 103985366 A | 8/2014 |
| CN | 104299590 A | 1/2015 |
| CN | 105047228 A | 11/2015 |
| CN | 105096865 A | 11/2015 |
| CN | 105096889 A | 11/2015 |
| CN | 105427799 A | 3/2016 |
| CN | 105895046 A | 8/2016 |
| JP | 2007317344 A | 12/2007 |

OTHER PUBLICATIONS

First Office Action for Chinese Patent Application No. 201610454724.2 dated Nov. 30, 2017.
Second Office Action for Chinese Patent Application No. 201610454724.2 dated Jun. 8, 2018.

* cited by examiner

SHIFT REGISTER, GATE DRIVING CIRCUIT AND DISPLAY DEVICE

RELATED APPLICATION

The present application is the U.S. national phase entry of PCT/CN2017/070259, with an international filling date of Jan. 5, 2017, which claims the benefit of Chinese Patent Application No. 201610454724.2, filed on Jun. 23, 2016, the entire disclosure of which is incorporated herein by reference.

FIELD OF THE DISCLOSURE

The present disclosure relates to the field of display technology, and more particularly to a shift register, a gate driving circuit and a display device.

BACKGROUND

With the development of technology, in order to meet people's requirements on various types of display devices such as an LCD in terms of aesthetics and usage, it has become a trend to narrow the frames of these display devices. For a display device such as an LCD, the gate driving circuit (GOA) is an important factor affecting the size of the frame of the display device. The existing gate driving circuit typically includes a plurality of cascaded shift registers, each of which outputs a scanning signal for driving a row of pixel switches. However, such a gate driving circuit generally includes a large number of shift registers, accordingly, the number of switching devices included and the number of signal lines are also large, which is detrimental to narrowing for the frame of the display device.

SUMMARY

Embodiments of the present disclosure provide a shift register, a gate driving circuit comprising the shift register, and a display device comprising the gate driving circuit, so as to facilitate narrowing to the frame of the display device.

An embodiment of the present disclosure provides a shift register. The shift register comprises: an input unit which is connected to an input terminal and a first node, respectively, and used for controlling a potential of the first node by an input signal of the input terminal, a first control unit which is connected to a second node and a first reference voltage, respectively, and is used for outputting the first reference voltage to the second node, a second control unit which is connected to the first node, the second node, and a second reference voltage, respectively, for controlling a potential of the second node based on the potential of the first node, a voltage gating unit which is connected to the first reference voltage, the second reference voltage, the first node, the second node, and an output unit, respectively, for outputting the first reference voltage to the output unit based on the potential of the first node, an energy storage unit which is connected to an output of the voltage gating unit and the first node, respectively, and a reset unit which is connected to a reset terminal and the first node, respectively, for controlling the potential of the first node by a reset signal of the reset terminal. The output unit is further connected to a first clock signal input terminal, a second clock signal input terminal, a first output terminal and a second output terminal, respectively, and the output unit is used for outputting a first pulse signal and a second pulse signal from the first output terminal and the second output terminal respectively based on a first clock signal and a second clock signal.

In some embodiments, the input unit may comprise a first transistor. The gate of the first transistor is used for receiving the input signal, a first terminal of the first transistor is connected to the first node, and a second terminal of the first transistor is used for receiving a third voltage signal.

In some embodiments, the reset unit may comprise a second transistor. The gate of the second transistor is used for receiving the reset signal, a first terminal of the second transistor is used for receiving a fourth voltage signal, and a second terminal of the second transistor is connected to the first node.

In some embodiments, the voltage gating unit may comprise a third transistor and a fourth transistor. A second terminal of the third transistor is connected to the first reference voltage, the gate of the third transistor is connected to the first node, the gate of the fourth transistor is connected to the second node, a first terminal of the fourth transistor is connected to the second reference voltage, and a first terminal of the third transistor and a second terminal of the fourth transistor are connected to the output unit.

In some embodiments, the energy storage unit may comprise a first capacitor. A first terminal of the first capacitor is connected to the first node, and a second terminal of the first capacitor is connected to the output of the voltage gating unit.

In some embodiments, the first control unit may comprise a fifth transistor. A first terminal of the fifth transistor is connected to the second node, and a second terminal and a gate of the fifth transistor are connected to the first reference voltage.

In some embodiments, the second control unit may comprise a sixth transistor and a second capacitor. A first terminal of the second capacitor and a first terminal of the sixth transistor are connected to the second reference voltage, a second terminal of the second capacitor and a second terminal of the sixth transistor are connected to the second node, and the gate of the sixth transistor is connected to the first node.

In some embodiments, the second control unit may further comprise a seventh transistor. The gate of the seventh transistor is connected to the second node, a first terminal of the seventh transistor is connected to the second reference voltage, and a second terminal of the seventh transistor is connected to the first node.

In some embodiments, the output unit may comprise an eighth transistor and a ninth transistor. The gate of the eighth transistor is connected to the first clock signal input terminal, the gate of the ninth transistor is connected to the second clock signal input terminal, a first terminal of the eighth transistor and a first terminal of the ninth transistor are connected to the output of the voltage gating unit, and a second terminal of the eighth transistor and a second terminal of the ninth transistor are used for outputting the first pulse signal and the second pulse signal, respectively.

Another embodiment of the present disclosure provides a gate driving circuit which may comprise a plurality of cascaded shift registers provided by any one of the embodiments described above.

In some embodiments, the gate driving circuit may comprise a first clock signal line, a second clock signal line, a third clock signal line and a fourth clock signal line for providing a first clock signal, a second clock signal, a third clock signal and a fourth clock signal respectively. The phases of the pulse signals of the first clock signal, the second clock signal, the third clock signal and the fourth clock signal are shifted by 90 degrees sequentially. A first clock signal input terminal and a second clock signal input terminal of a k-th shift register in the gate driving circuit are connected to the first clock signal line and the third clock signal line respectively, and a first clock signal input terminal and a second clock signal terminal of a (k+1)-th shift register are connected to the second clock signal line and the fourth clock signal line respectively, k being an integer greater than or equal to 1.

In some embodiments, in the plurality of cascaded shift registers, a reset terminal of the k-th shift register is connected to a second output terminal of the (k+1)-th shift register, a first output terminal of the k-th shift register is connected to an input terminal of the (k+1)-th shift register, and an input terminal of the first shift register is used to receive a vertical synchronization signal indicating a start of an image of a new frame.

A further embodiment of the present disclosure further provides a display device that may comprise the gate driving circuit provided by any one of the embodiments described above.

BRIEF DESCRIPTION OF THE DRAWINGS

Embodiments of the present disclosure will be described below in more detail by way of non-limiting examples with reference to the accompanying drawings, so as to provide a thorough understanding of the principles and spirit of the present disclosure.

DETAILED DESCRIPTION OF EMBODIMENTS

Figure 1:
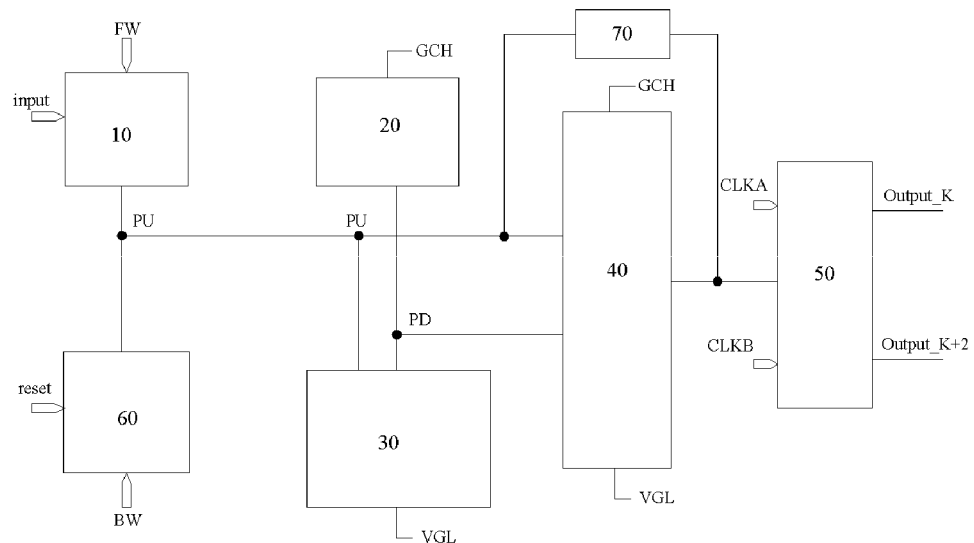
FIG. 1 illustrates a block diagram for a shift register provided by an embodiment of the present disclosure.

Hereinafter, specific embodiments of the present disclosure will be described in detail by way of examples. It is to be understood that the embodiments of the invention are not limited to the examples set forth below, and modifications and variations can be made by those skilled in the art to the described embodiments using the principles or spirit revealed by the present disclosure, so as to obtain other different embodiments. Apparently, these embodiments all fall within the scope of the present invention.

In addition, it is to be noted that the drawings referred to herein are for the purpose of illustrating and explaining the embodiments of the present disclosure, each unit embodied in the drawings is not necessarily identical to the actual circuit configuration, and the connections between different units are merely used for illustrating the embodiments of the present disclosure, which are not to be construed as limiting the scope of the invention. The technical features in the embodiments of the present disclosure may be combined with each other without causing conflict.

Furthermore, a first terminal and a second terminal of a transistor as referred to herein are used to distinguish two terminals of the transistor other than the gate thereof, one of which is referred to as a first terminal and the other is referred to as a second terminal. The first terminal and the second terminal of the transistor are symmetrical, so they are interchangeable. It is also to be understood that the term "connect" mentioned herein may be used to indicate a direct connection between two elements or an indirect connection between the two elements (i.e. other elements may be present between the two elements).

FIG. 1 illustrates a block diagram of the configuration of a shift register according to an embodiment of the present disclosure. As shown in FIG. 1, the shift register according to an embodiment of the present disclosure comprises: an input unit 10, which is connected to an input terminal input and a first node PU respectively, and controls the potential of the first node PU by an input signal of the input terminal input; a first control unit 20 which is connected to a second node PD and a first reference voltage GCH, respectively, and used for outputting the first reference voltage GCH to the second node PD; a second control unit 30, which is connected to the first node PU, the second node PD and a second reference voltage VGL respectively for controlling the potential of the second node PD based on the potential of the first node PU; a voltage gating unit 40 which is connected to the first reference voltage GCH, the second reference voltage VGL, the first node PU, the second node PD and an output unit 50, respectively, and used for outputting the first reference voltage GCH to the output unit 50 based on the potential of the first node PU; an energy storage unit 70 which is connected to an output of the voltage gating unit 40 and the first node PU, respectively; and a reset unit 60 which is connected to a reset terminal reset and the first node PU, respectively, and used for controlling the potential of the first node PU by a reset signal of the reset terminal reset. In this embodiment, the output unit 50 is further connected to a first clock signal input terminal CLKA, a second clock signal input terminal CLKB, a first output terminal Output_K and a second output terminal Output_K+2, respectively, and used for outputting a first pulse signal and a second pulse signal from the first output terminal Output_K and the second output terminal Output_K+2 respectively based on the first clock signal and the second clock signal.

The shift register proposed by embodiments of the present disclosure can be used as a unit circuit in the gate driving circuit (GOA), which can output two signals simultaneously for driving the pixel switches. Therefore, for one and the same display device, the number of shift registers required in the gate driving circuit can be reduced, thereby reducing the number of switching devices in the gate driving circuit and the number of required signal lines. As a result, the structure of the gate driving circuit is simplified and the area occupied by the gate driving circuit is saved, so that the frame of the display device can be made narrower. At the same time, since the number of switching devices is reduced, it is also conducive to reducing the power consumption by the gate driving circuit, which in turn reduces the power consumption of the display device.

Figure 2:
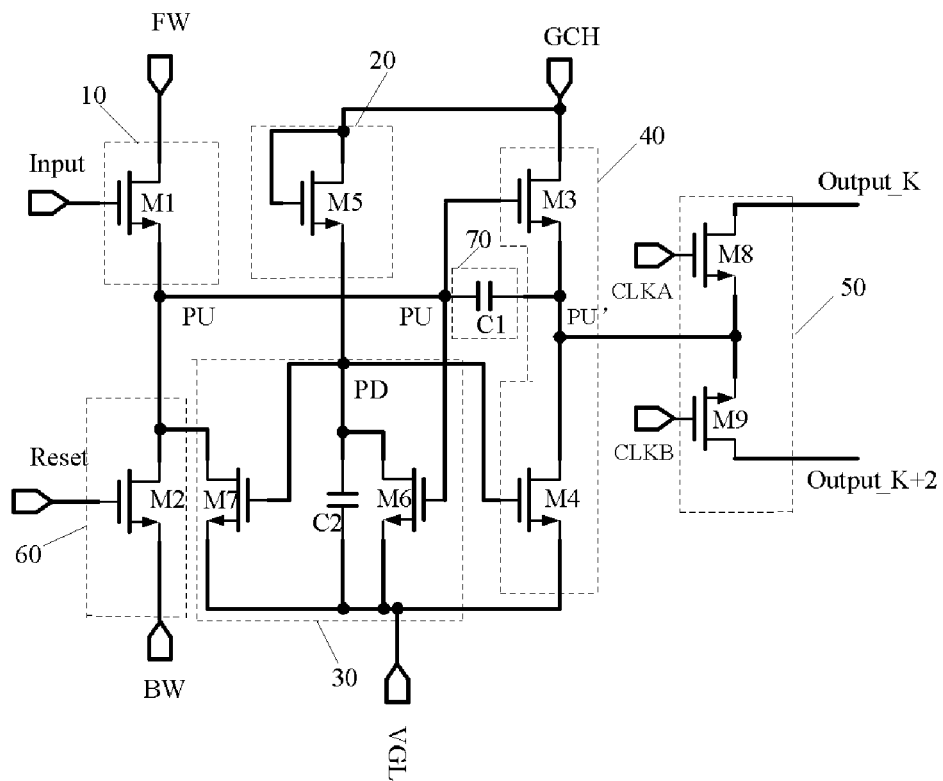
FIG. 2 illustrates a circuit diagram of a shift register provided by an embodiment of the present disclosure.

FIG. 2 illustrates a specific circuit configuration of a shift register according to an embodiment of the present disclosure. In order to facilitate understanding of the embodiment of FIG. 2 with reference to FIG. 1, the respective units of the shift register are schematically shown in FIG. 2 by dashed boxes.

As shown in FIG. 2, the input unit 10 may comprise a first transistor M1. The gate of the transistor M1 is used for receiving an input signal, a first terminal (e.g. source) of the first transistor M1 is connected to the first node PU, and a second terminal (e.g. drain) of the first transistor M1 is used for receiving a third voltage signal FW. In this embodiment, the third voltage signal may be a constant voltage having a high voltage level or a constant voltage having a low voltage level. In this context, the high voltage level can also be referred to as logic "1", and the low voltage level can also be referred to as logic "0". The first transistor M1 may control the potential of the first node PU based on the input signal of the input terminal input. For example, the first transistor M1 may be an N-type thin film transistor (TFT), in this case, it may receive an input signal of a high voltage level and thus be turned on, so that the potential of the first node PU is equal to the voltage of the third voltage signal FW.

In an embodiment, as shown in FIG. 2, the reset unit may comprise a second transistor M2. The gate of the second transistor M2 is used for receiving a reset signal, a first terminal of the second transistor M2 is used for receiving a fourth voltage signal BW, and a second terminal of the second transistor M2 is connected to the first node PU. When the gate of the second transistor M2 receives a reset signal and the second transistor M2 is thus turned on, the potential of the first node PU is equal to the voltage of the fourth voltage signal BW. In embodiments of the present disclosure, the fourth voltage signal BW may also be a constant voltage signal, but the voltage level thereof is different from that of the third voltage signal FW. For example, if the third voltage signal FW is at a high voltage level (logic "1"), the fourth voltage signal BW is at a low voltage level (logic "0"), and vice versa. The voltage levels of the third voltage signal FW and the fourth voltage signal BW may be set or changed. In embodiments of the present disclosure, the second reference voltage VGL may have a low voltage level, and the first reference voltage GCH may have a high voltage level.

In an embodiment of the present disclosure, the voltage gating unit 40 comprises a third transistor M3 and a fourth transistor M4. A second terminal of the third transistor M3 is connected to the first reference voltage GCH, the gate of the third transistor M3 is connected to the first node PU, the gate of the fourth transistor M4 is connected to the second node PD, a first terminal of the fourth transistor M4 is connected to the second reference voltage VGL, and a first terminal of the third transistor M3 and a second terminal of the fourth transistor M4 are connected to the output unit 50. As shown in FIG. 2, in this embodiment, the second terminal of the fourth transistor M4 and the first terminal of the third transistor M3 are interconnected to a node PU'.

In an embodiment of the present disclosure, the energy storage unit may comprise a first capacitor C1. A first terminal of the first capacitor C1 is connected to the first node PU, and a second terminal of the first capacitor C1 is connected to the output of the voltage gating unit 40.

The first control unit 20 may comprise a fifth transistor M5. A first terminal of the fifth transistor M5 is connected to the second node PD, and a second terminal and the gate of the fifth transistor M5 are connected to the first reference voltage GCH. The second control unit 30 may comprise a sixth transistor M6 and a second capacitor C2. A first terminal of the second capacitor C2 and a first terminal of the sixth transistor M6 are connected to the second reference voltage VGL, a second terminal of the second capacitor C2 and a second terminal of the sixth transistor M6 are connected to the second node PD, and the gate of the sixth transistor M6 is connected to the first node PU. That is, the second capacitor C2 may be connected in parallel to the sixth transistor M6.

In an embodiment of the present disclosure, the second control unit 30 may further comprise a seventh transistor M7. The gate of the seventh transistor M7 is connected to the second node PD, a first terminal of the seventh transistor M7 is connected to the second reference voltage VGL, and a second terminal of the seventh transistor M7 is connected to the first node PU.

The output unit 50 may comprise an eighth transistor M8 and a ninth transistor M9. The gate of the eighth transistor M8 is connected to the first clock signal input terminal CLKA, the gate of the ninth transistor M9 is connected to the second clock signal input terminal CLKB, a first terminal of the eighth transistor M8 and a first terminal of the ninth transistor M9 are connected to the output of the voltage gating unit 40, and a second terminal of the eighth transistor M8 and a second terminal of the ninth transistor M9 are used for outputting the first pulse signal and the second pulse signal, respectively.

The shift register provided by the embodiment shown in FIG. 2 can be used as a unit circuit in the gate driving circuit, i.e. a plurality of such cascaded shift registers may form a gate driving circuit, each of which can provide a first pulse signal and a second pulse signal that may be used as scanning signals for two rows of pixels. In addition, by setting the voltage levels of the third voltage signal FW and the fourth voltage signal BW, different scanning modes can be realized. For example, forward scanning can be achieved by making FW=1, BW=0, and backward scanning can be achieved by making FW=0, BW=1. The operating process of the shift register provided by embodiments of the present disclosure for providing scanning signals in the gate driving circuit will be described below in detail with reference to FIGS. 2 and 3.

As shown in FIG. 2, the transistors in the shift register may be N-type thin film transistors. Of course, in other embodiments, the transistors in the shift register may also be switching devices of other types, such as P-type field effect transistors, N-type field effect transistors, P-type thin film transistors, and the like, which are not limited in embodiments of the present disclosure. The operation process of the shift register is described below based on an example that the transistors M1-M9 are N-type thin film transistors and the scanning mode is forward scanning (FW=1, BW=0). When the input signal provided to the input unit 10 becomes a high level, the transistor M1 is turned on, and at that time, the reset signal of the reset terminal Reset remains at a low level. Since the transistor M1 is turned on, the potential of the first node PU becomes a high level, thereby charging the energy storage unit (first capacitor C1). Charges accumulate on the first terminal of the first capacitor C1 so that the third transistor M3 and the sixth transistor M6 are turned on. Since the third transistor M3 is turned on, the potential of the second terminal PU' of the first capacitor C1 is equal to the first reference voltage GCH. Since the sixth transistor M6 is turned on, the second capacitor C2 is discharged via the sixth transistor M6, and the potential of the second node PD is equal to the second reference voltage VGL. That is, it can be considered that the potential of the second node PD is logic "0" and the potential of the node PU' is logic "1" at that time, thus the fourth transistor M4 and the seventh transistor M7 are both turned off. If the eighth transistor M8 or the ninth transistor M9 receives a corresponding clock signal and is thus turned on, the shift register can output the first pulse signal or the second pulse signal from the second terminal of the eighth transistor M8 or the second terminal of the ninth transistor M9, respectively. When the input signal of the input terminal input becomes a low level, the first transistor M1 will be turned off. However, due to the potential holding effect of the energy storage unit (first capacitor C1), the first node PU can remain at a high voltage level, so that the node PU' remains at a high voltage level. Thus, the shift register can maintain the previous operating state. At that time, if the clock signal at the first clock signal input terminal CLKA or the second clock signal input terminal CLKB enables the eighth transistor M8 or the ninth transistor M9 to be turned on, the first pulse signal or the second pulse signal may continue to be outputted. When the shift register receives a valid reset signal (i.e. Reset=1) from the reset terminal Reset, the second transistor M2 is turned on so that the potential of the first node PU is equal to the fourth voltage signal BW, that is, the potential of the node PU is logic "0". Therefore, the third transistor M3 and the sixth transistor M6 are turned off, and the potential of the second node PD becomes a high voltage level, that is, the potential of the PD is logic "1". In this way, the fourth transistor M4 and the seventh transistor M7 are turned on, the voltage level of the output of the voltage gating unit 40 (i.e. the node PU' between the third transistor M3 and the fourth transistor M4) is equal to the second reference voltage VGL. Since the voltage level of the node PU' is logic "0", the output unit 50 does not output the first pulse signal or the second pulse signal at that time. When the reset signal is invalid (Reset=0), since the fifth transistor M5 remains turned on, the potential of the second node PD is at a high voltage level. In this way, the seventh transistor M7 and the fourth transistor M4 are turned on, such that the potentials of the first node PU and the node PU' are at a low voltage level, that is, PU=PU'=0. At that time, the shift register still does not output the first pulse signal or the second pulse signal.

Figure 3:
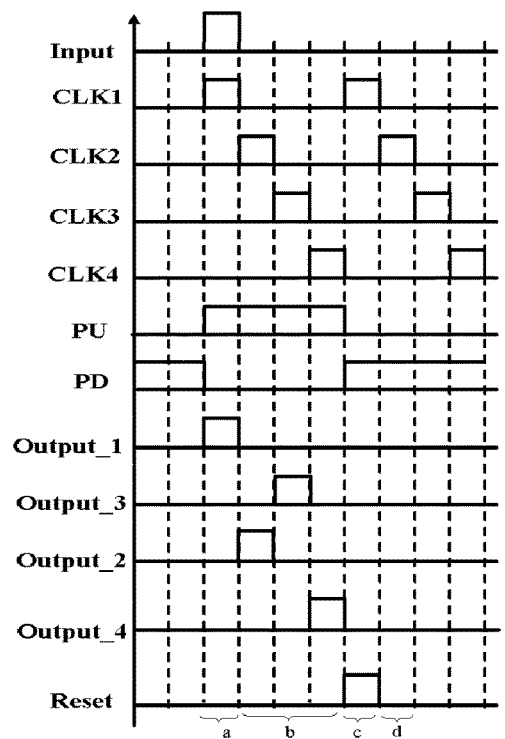
FIG. 3 illustrates a timing diagram for a shift register provided by an embodiment of the present disclosure when it is in operation.

As shown in FIG. 3, the operating process of the shift register may include four periods a, b, c and d. The four clock signals CLK1, CLK2, CLK3 and CLK4 in FIG. 3 are periodic clock signals generated by a clock signal generating circuit. When the shift register is used for providing scanning signals, the clock signals CLK1, CLK3 may be provided to the gates of the eighth transistor M8 and the ninth transistor M9, respectively, or the eighth transistor M8 and the ninth transistor M9 may receive the clock signals CLK2, CLK4, respectively. At the beginning of the period a, the shift register receives a valid input signal (Input=1) so that the potential of the first node PU changes to a high voltage level, i.e. PU=1, so that PU'=1. When the eighth transistor M8 receives the clock signal CLK1 and is thus turned on, the first pulse signal can be outputted from the first output terminal Output_K. When the ninth transistor M9 receives the clock signal CLK3 and is thus turned on, the second pulse signal can be outputted from the second output terminal Output_K+2. During the period b, although the input signal becomes a low voltage level, the first capacitor C1 may keep the potential of the first node PU at a high voltage level, so that the shift register maintains the operating state in the period a. At the beginning of the period c, the shift register changes the potential of the first node PU to a low voltage level due to the receipt of a valid reset signal, and the shift register no longer outputs a valid scanning signal at that time. During the period d, the shift register maintains the previous operating state despite the absence of a valid reset signal, and can not provide a valid scanning signal until a valid input signal is received again.

Figure 4:
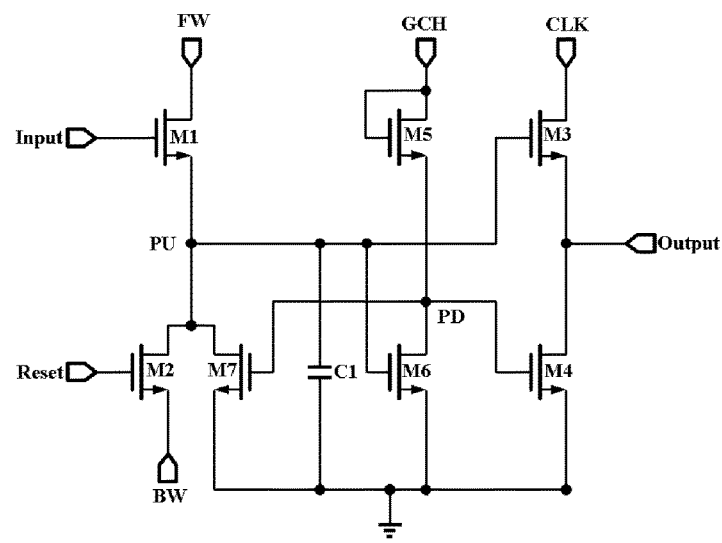
FIG. 4 illustrates a circuit diagram of a conventional shift register.

Therefore, the embodiment of the present disclosure enables a shift register to provide two driving signals simultaneously with fewer electronic elements. FIG. 4 illustrates a circuit diagram of a conventional shift register for a gate driving circuit. As shown in FIG. 4, the conventional shift register comprises seven switching devices, but only one driving signal can be provided. If two driving signals need to be provided, at least fourteen switching devices are required. As shown in FIG. 2, the shift register provided by an embodiment of the present disclosure is capable of providing two driving signals with only nine switching devices. As a result, the circuit configuration and wiring are simplified, facilitating narrowing of the frame of the display device.

Another embodiment of the present disclosure provides a gate driving circuit that may comprise a plurality of cascaded shift registers as described in any one of the preceding embodiments. As described above, since each shift register can output two driving signals with fewer switching devices, the total number of switching devices included in the gate driving circuit is reduced and the area occupied by the gate driving circuit is decreased, which further facilitates narrowing to the frame of the display device.

Figure 5:
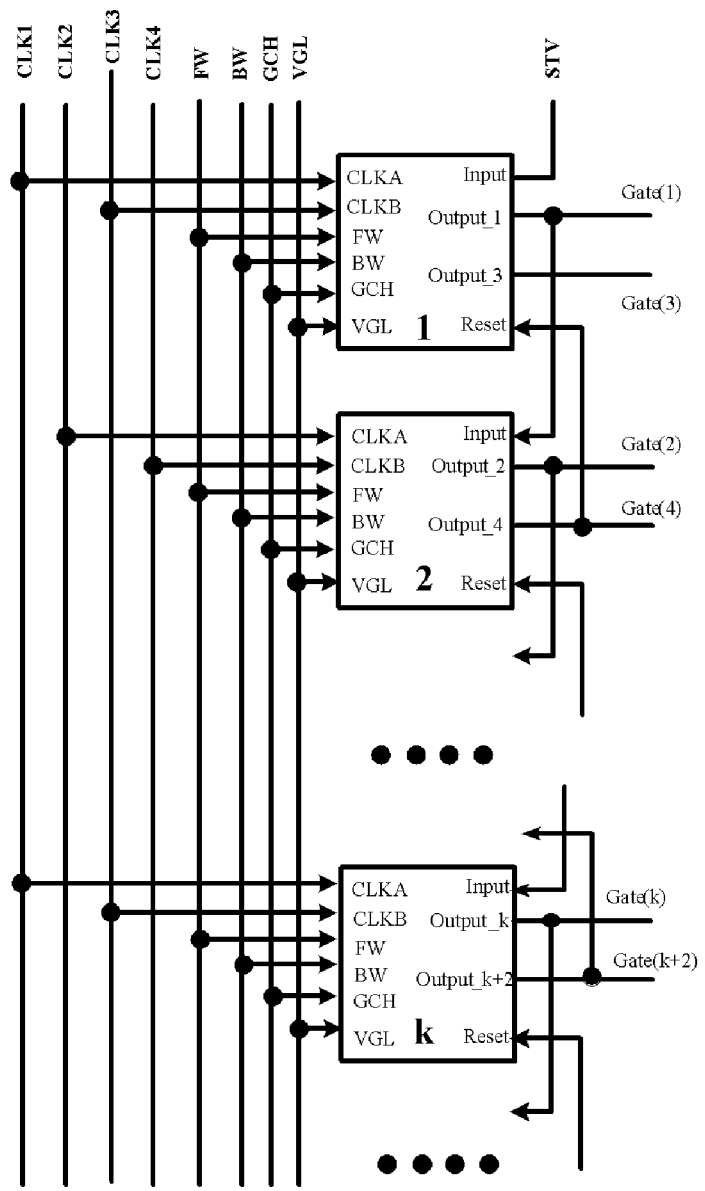
FIG. 5 illustrates a block diagram for a gate driving circuit provided by another embodiment of the present disclosure.

FIG. 5 schematically shows a block diagram for a gate driving circuit provided by an embodiment of the present disclosure. As shown in FIG. 5, the gate driving circuit may comprise a first clock signal line, a second clock signal line, a third clock signal line and a fourth clock signal line for providing a first clock signal CLK1, a second clock signal CLK2, a third clock signal CLK3 and a fourth clock signal CLK4, respectively. The phases of the pulse signals of the first clock signal CLK1, the second clock signal CLK2, the third clock signal CLK3 and the fourth clock signal CLK4 are shifted by 90 degrees sequentially. A first clock signal input terminal CLKA and a second clock signal input terminal CLKB of the k-th shift register in the gate driving circuit may be connected to the first clock signal line and the third clock signal line, respectively, and a first clock signal input terminal CLKA and a second clock signal input terminal CLKB of the (k+1)-th shift register may be connected to the second clock signal line and the fourth clock signal line, respectively, where k is an integer greater than or equal to 1. Referring to FIG. 3 again, the phases of the pulse signals of the first clock signal CLK1, the second clock signal CLK2, the third clock signal CLK3 and the fourth clock signal CLK4 are shifted by 90 degrees sequentially, thus high level pulse signals occur in time for the four clock signals CLK1-CLK4 one after the other, i.e. the pulse signals of the first clock signal CLK1 and the third clock signal CLK3 may be different by 180 degrees in phase, and the pulse signals of the second clock signal CLK2 and the fourth clock signal CLK4 may be different by 180 degrees in phase. In the embodiment shown in FIG. 5, each shift register may receive the first clock signal CLK1 and the third clock signal CLK3, or the second clock signal CLK2 and the fourth clock signal CLK4, respectively, so that the eighth transistor and the ninth transistor in the output unit of each shift register can be provided with dead time to ensure that the eighth transistor and the ninth transistor would not be turned on at the same time, so that the gate driving circuit provides driving signals in a row by row manner, i.e. realizing progressive scanning. As shown in FIG. 5, each shift register in the gate driving circuit may further receive the third voltage signal FW and the fourth voltage signal BW, which can provide driving signals in different ways by adjusting the voltage levels of the third voltage signal FW and the fourth voltage signal BW. In an embodiment of the present disclosure, when FW=1 and BW=0, the driving signals are provided in a forward scanning mode, and when FW=0 and BW=1, the driving signals are provided in a backward scanning mode.

Referring to FIG. 5 again, in the plurality of cascaded shift registers, the reset terminal of the k-th shift register may be connected to the second output terminal of the (k+1)-th shift register, the first output terminal of the k-th shift register may be connected to the input terminal of the (k+1)-th shift register, and the input terminal of the first shift register is used to receive a vertical synchronization signal STV indicating the start of an image of a new frame. In other words, in the embodiment of FIG. 5, for two adjacent shift registers in the plurality of cascaded shift registers, the reset terminal of the former shift register may be connected to the second output terminal of the latter shift register adjacent thereto, the first output terminal of the former shift register may be connected to the input terminal of the latter shift register adjacent thereto, and the input terminal of the first shift register may receive a vertical synchronization signal STV indicating the start of an image of a new frame. As shown in FIG. 5, the first shift register may provide gate driving signals for the first and third rows of pixels, the second shift register may provide gate driving signals for the second and fourth rows of pixels, and the k-th shift register may provide gate driving signals for the k-th and (k+2)-th rows of pixels. In this way, the driving signals can be provided successively for respective rows of pixels, thereby realizing progressive scanning driving for the pixel switches.

Another embodiment of the present disclosure provides a display device that may comprise the gate driving circuit provided by any one of the preceding embodiments. The display device may be any product or component having a display function such as a mobile phone, a tablet computer, a television set, a display, a notebook computer, a digital photo frame, a navigator, or the like. Other indispensable constituent parts of the display device are all essential ones as understood by those ordinarily skilled in the art, which are not described here for simplicity and should not be construed as limitation to the present invention.

While the embodiments of the present disclosure have been described in detail with reference to the accompanying drawings, it is to be noted that the above-described embodiments are intended to illustrate and not limit the present invention, and those skilled in the art will be able to design many alternative embodiments without departing from the scope of the appended claims. In the claims, the word "comprising" does not exclude other elements or steps than those enumerated in the claims, and the indefinite article "a" or "an" does not exclude a plurality. The mere fact that certain measures are recited in mutually different dependent claims does not indicate that a combination of these measures cannot be used to advantage.

The invention claimed is:

1. A shift register comprising:
an input unit connected to an input terminal and a first node (PU) respectively, the input unit being used for controlling a potential of the first node (PU) by an input signal of the input terminal,
a first control unit which is connected to a second node (PD) and a first reference voltage (GCH), respectively, and is used for outputting the first reference voltage to the second node (PD),
a second control unit which is connected to the first node (PU), the second node (PD), and a second reference voltage (VGL), respectively, for controlling a potential of the second node (PD) based on the potential of the first node (PU),
a voltage gating unit which is connected to the first reference voltage (GCH), the second reference voltage (VGL), the first node (PU), the second node (PD), and an output unit, respectively, for outputting the first reference voltage to the output unit based on the potential of the first node (PU),
an energy storage unit which is connected to an output of the voltage gating unit and the first node (PU), respectively, and
a reset unit which is connected to a reset terminal and the first node (PU) respectively, for controlling the potential of the first node (PU) by a reset signal of the reset terminal,
wherein the output unit is further connected to a first clock signal input terminal, a second clock signal input terminal, a first output terminal and a second output terminal, respectively, the output unit is used for outputting a first pulse signal and a second pulse signal from the first output terminal and the second output terminal respectively based on a first clock signal and a second clock signal.

2. The shift register according to claim 1, wherein the input unit comprises a first transistor, a gate of the first transistor being used for receiving the input signal, a first terminal of the first transistor being connected to the first node, a second terminal of the first transistor being used for receiving a third voltage signal.

3. The shift register according to claim 1, wherein the reset unit comprises a second transistor, a gate of the second transistor being used for receiving the reset signal, a first terminal of the second transistor being used for receiving a fourth voltage signal, a second terminal of the second transistor being connected to the first node.

4. The shift register according to claim 1, wherein the voltage gating unit comprises a third transistor and a fourth transistor, a second terminal of the third transistor being connected to the first reference voltage, a gate of the third transistor being connected to the first node, a gate of the fourth transistor being connected to the second node, a first terminal of the fourth transistor being connected to the second reference voltage, a first terminal of the third transistor and a second terminal of the fourth transistor being connected to the output unit.

5. The shift register according to claim 1, wherein the energy storage unit comprises a first capacitor, a first terminal of the first capacitor being connected to the first node, a second terminal of the first capacitor being connected to the output of the voltage gating unit.

6. The shift register according to claim 1, wherein the first control unit comprises a fifth transistor, a first terminal of the fifth transistor being connected to the second node, a second terminal and a gate of the fifth transistor being connected to the first reference voltage.

7. The shift register according to claim 1, wherein the second control unit comprises a sixth transistor and a second capacitor, a first terminal of the second capacitor and a first terminal of the sixth transistor being connected to the second reference voltage, a second terminal of the second capacitor and a second terminal of the sixth transistor being connected to the second node, a gate of the sixth transistor being connected to the first node.

8. The shift register according to claim 7, wherein the second control unit further comprises a seventh transistor, a gate of the seventh transistor being connected to the second node, a first terminal of the seventh transistor being connected to the second reference voltage, a second terminal of the seventh transistor being connected to the first node.

9. The shift register according to claim 1, wherein the output unit comprises an eighth transistor and a ninth transistor, a gate of the eighth transistor being connected to the first clock signal input terminal, a gate of the ninth transistor being connected to the second clock signal input terminal, a first terminal of the eighth transistor and a first terminal of the ninth transistor being connected to the output of the voltage gating unit, a second terminal of the eighth transistor and a second terminal of the ninth transistor being used for outputting the first pulse signal and the second pulse signal, respectively.

10. A gate driving circuit comprising a plurality of cascaded shift registers,
wherein each of the plurality of shift registers comprises
an input unit connected to an input terminal and a first node (PU) respectively, the input unit being used for controlling a potential of the first node (PU) by an input signal of the input terminal,
a first control unit which is connected to a second node (PD) and a first reference voltage (GCH), respectively, and is used for outputting the first reference voltage to the second node (PD),
a second control unit which is connected to the first node (PU), the second node (PD), and a second reference voltage (VGL), respectively, for controlling a potential of the second node (PD) based on the potential of the first node (PU),
a voltage gating unit which is connected to the first reference voltage (GCH), the second reference voltage (VGL), the first node (PU), the second node (PD), and an output unit, respectively, for outputting the first reference voltage to the output unit based on the potential of the first node (PU),
an energy storage unit which is connected to an output of the voltage gating unit and the first node (PU), respectively, and
a reset unit which is connected to a reset terminal and the first node (PU) respectively, for controlling the potential of the first node (PU) by a reset signal of the reset terminal,
wherein the output unit is further connected to a first clock signal input terminal, a second clock signal input terminal, a first output terminal and a second output terminal, respectively, the output unit is used for outputting a first pulse signal and a second pulse signal from the first output terminal and the second output terminal respectively based on a first clock signal and a second clock signal.

11. The gate driving circuit according to claim 10, wherein the gate driving circuit comprises a first clock signal line, a second clock signal line, a third clock signal line and a fourth clock signal line for providing a first clock signal, a second clock signal, a third clock signal and a fourth clock signal respectively, and phases of pulse signals of the first clock signal, the second clock signal, the third clock signal and the fourth clock signal are shifted by 90 degrees sequentially, wherein a first clock signal input terminal and a second clock signal input terminal of a k-th shift register in the gate driving circuit are connected to the first clock signal line and the third clock signal line respectively, a first clock signal input terminal and a second clock signal terminal of a (k+1)-th shift register are connected to the second clock signal line and the fourth clock signal line respectively, k being an integer greater than or equal to 1.

12. The gate driving circuit according to claim 11, wherein in the plurality of cascaded shift registers, a reset terminal of the k-th shift register is connected to a second output terminal of the (k+1)-th shift register,
wherein a first output terminal of the k-th shift register is connected to an input terminal of the (k+1)-th shift register, an input terminal of a first shift register is used for receiving a vertical synchronization signal indicating a start of an image of a new frame.

13. The gate driving circuit according to claim 10, wherein the input unit comprises a first transistor, a gate of the first transistor being used for receiving the input signal, a first terminal of the first transistor being connected to the first node, a second terminal of the first transistor being used for receiving a third voltage signal.

14. The gate driving circuit according to claim 13, wherein the reset unit comprises a second transistor, a gate of the second transistor being used for receiving the reset signal, a first terminal of the second transistor being used for receiving a fourth voltage signal, a second terminal of the second transistor being connected to the first node.

15. The gate driving circuit according to claim 14, wherein the voltage gating unit comprises a third transistor and a fourth transistor, a second terminal of the third transistor being connected to the first reference voltage, a gate of the third transistor being connected to the first node, a gate of the fourth transistor being connected to the second node, a first terminal of the fourth transistor being connected to the second reference voltage, a first terminal of the third transistor and a second terminal of the fourth transistor being connected to the output unit.

16. The gate driving circuit according to claim 15, wherein the energy storage unit comprises a first capacitor, a first terminal of the first capacitor being connected to the first node, a second terminal of the first capacitor being connected to the output of the voltage gating unit.

17. The gate driving circuit according to claim 16, wherein the first control unit comprises a fifth transistor, a first terminal of the fifth transistor being connected to the second node, a second terminal and a gate of the fifth transistor being connected to the first reference voltage.

18. A display device comprising: a gate driving circuit having a plurality of cascaded shift registers, wherein each of the plurality of shift registers comprises
an input unit connected to an input terminal and a first node (PU) respectively, the input unit being used for controlling a potential of the first node (PU) by an input signal of the input terminal,
a first control unit which is connected to a second node (PD) and a first reference voltage (GCH), respectively, and is used for outputting the first reference voltage to the second node (PD),
a second control unit which is connected to the first node (PU), the second node (PD), and a second reference voltage (VGL), respectively, for controlling a potential of the second node (PD) based on the potential of the first node (PU),
a voltage gating unit which is connected to the first reference voltage (GCH), the second reference voltage (VGL), the first node (PU), the second node (PD), and an output unit, respectively, for outputting the first reference voltage to the output unit based on the potential of the first node (PU),
an energy storage unit which is connected to an output of the voltage gating unit and the first node (PU), respectively, and
a reset unit which is connected to a reset terminal and the first node (PU) respectively, for controlling the potential of the first node (PU) by a reset signal of the reset terminal,
wherein the output unit is further connected to a first clock signal input terminal, a second clock signal input terminal, a first output terminal and a second output terminal, respectively, the output unit is used for outputting a first pulse signal and a second pulse signal from the first output terminal and the second output terminal respectively based on a first clock signal and a second clock signal.

19. The display device according to claim 18, wherein the gate driving circuit comprises a first clock signal line, a second clock signal line, a third clock signal line and a fourth clock signal line for providing a first clock signal, a second clock signal, a third clock signal and a fourth clock signal respectively, and phases of pulse signals of the first clock signal, the second clock signal, the third clock signal and the fourth clock signal are shifted by 90 degrees sequentially, wherein a first clock signal input terminal and a second clock signal input terminal of a k-th shift register in the gate driving circuit are connected to the first clock signal line and the third clock signal line respectively, a first clock signal input terminal and a second clock signal terminal of a (k+1)-th shift register are connected to the second clock signal line and the fourth clock signal line respectively, k being an integer greater than or equal to 1.

20. The display device according to claim 19, wherein in the plurality of cascaded shift registers, a reset terminal of the k-th shift register is connected to a second output terminal of the (k+1)-th shift register, wherein a first output terminal of the k-th shift register is connected to an input terminal of the (k+1)-th shift register, an input terminal of a first shift register is used for receiving a vertical synchronization signal indicating a start of an image of a new frame.

* * * * *